United States Patent
Ikeda

(10) Patent No.: US 11,056,175 B1
(45) Date of Patent: Jul. 6, 2021

(54) SEMICONDUCTOR DEVICE AND MANUFACTURING METHOD THEREOF

(71) Applicant: Winbond Electronics Corp., Taichung (TW)

(72) Inventor: Noriaki Ikeda, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/940,411

(22) Filed: Jul. 28, 2020

(51) Int. Cl.
| | |
|---|---|
| *G11C 11/40* | (2006.01) |
| *G11C 11/408* | (2006.01) |
| *G11C 11/402* | (2006.01) |
| *H01L 27/108* | (2006.01) |
| *G11C 5/06* | (2006.01) |
| *G11C 11/24* | (2006.01) |

(52) U.S. Cl.
CPC ............ *G11C 11/4085* (2013.01); *G11C 5/06* (2013.01); *G11C 11/24* (2013.01); *G11C 11/4023* (2013.01); *H01L 27/10829* (2013.01); *H01L 27/10891* (2013.01)

(58) Field of Classification Search
None
See application file for complete search history.

(56) References Cited

U.S. PATENT DOCUMENTS

| | | | |
|---|---|---|---|
| 5,963,789 A | 10/1999 | Tsuchiaki | |
| 6,072,711 A * | 6/2000 | Kang | ............... G11C 11/22 257/E21.68 |
| 6,172,898 B1 * | 1/2001 | Kajiyama | ......... H01L 27/10867 257/301 |
| 6,232,171 B1 | 5/2001 | Mei | |
| 6,245,636 B1 | 6/2001 | Maszara | |
| 7,935,602 B2 | 5/2011 | Wang et al. | |
| 8,735,267 B1 | 5/2014 | Park et al. | |
| 9,842,841 B2 * | 12/2017 | Kim | ................. H01L 27/10814 |
| 2008/0266927 A1 * | 10/2008 | Lee | ................... H01L 27/10876 365/63 |
| 2020/0161305 A1 * | 5/2020 | Nam | ................... H01L 29/0649 |

FOREIGN PATENT DOCUMENTS

CN           208655651         3/2019

OTHER PUBLICATIONS

Huang-Nan Chen et al., "Semiconductor Structure and Manufacturing Method Thereof", Unpublished U.S. Appl. No. 16/419,021, filed May 22, 2019.

\* cited by examiner

*Primary Examiner* — Tan T. Nguyen
(74) *Attorney, Agent, or Firm* — JCIPRNET

(57) ABSTRACT

A semiconductor device and a manufacturing method thereof are provided. The semiconductor device includes a semiconductor substrate, word lines and bit lines. The semiconductor substrate has active regions separated from one another and extending along a first direction. The word lines are formed in the semiconductor substrate. The active regions are respectively intersected with one or more of the word lines. The word lines respectively have thick portions and a narrow portion continuously extending on the thick portions along a second direction. The thick portions are located at where the word lines are intersected with the active regions. The bit lines are formed over the semiconductor substrate, and extending along a third direction intersected with the first and second directions.

20 Claims, 14 Drawing Sheets

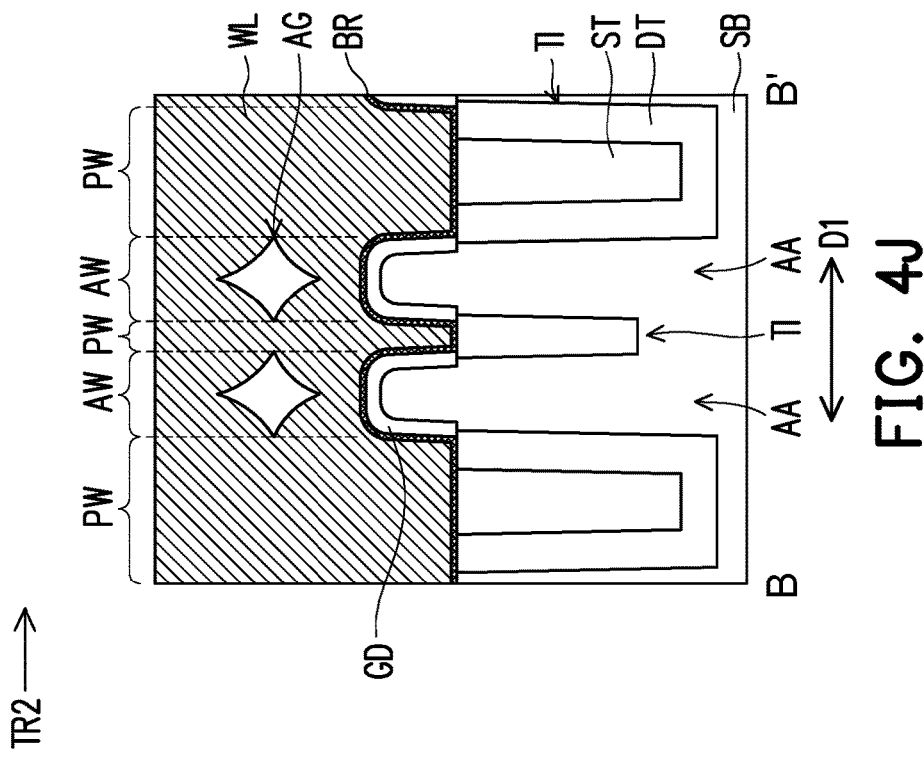
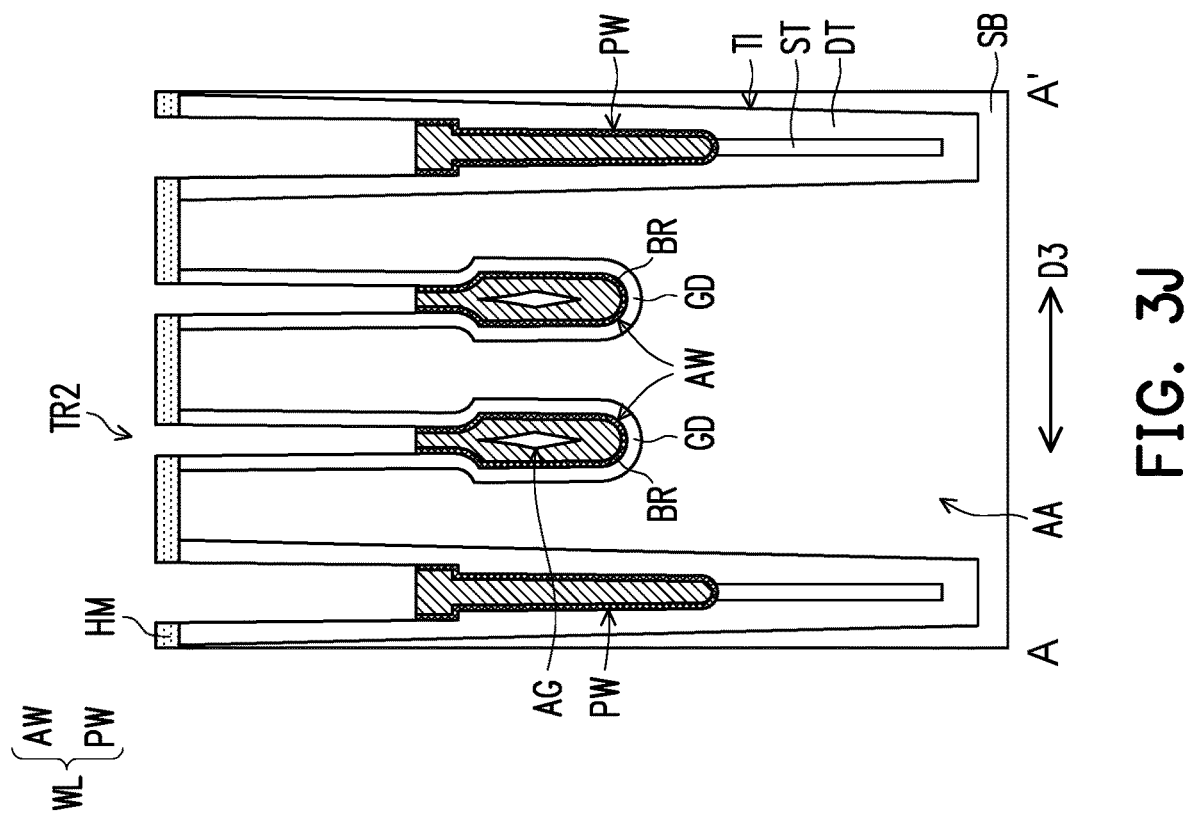

SEMICONDUCTOR DEVICE AND MANUFACTURING METHOD THEREOF

BACKGROUND

Technical Field

The present disclosure relates to a semiconductor device and a manufacturing method thereof, and particularly, to a dynamic random access memory (DRAM) device and a manufacturing method thereof.

Description of Related Art

Dynamic random access memory (DRAM) is a widely used volatile read/write semiconductor memory device. As feature size of a DRAM cell is reduced, spacing between adjacent word lines is shortened. Consequently, a contact area between an active region between adjacent word lines and an overlying capacitor contact has become smaller, thus result in write recovery time (tWR) failure. Several solutions have been used to solve such problem, but none of these solutions can be used without inducing undesired side effects. For instance, one of these solutions includes reducing isolation width between adjacent word lines, which may result in interference between adjacent DRAM cells. As another example, width/diameter of the word lines is reduced for gaining extra contact area of the active region, but conductivity of the word lines may be compromised.

SUMMARY

In an aspect of the present disclosure, a semiconductor device is provided. The semiconductor device comprises: a semiconductor substrate, having active regions separated from one another and extending along a first direction; word lines, formed in the semiconductor substrate, wherein the active regions are respectively intersected with one or more of the word lines, the word lines respectively have separate thick portions and a narrow portion continuously extending on the thick portions along a second direction, and the thick portions are located at where the word lines are intersected with the active regions; and bit lines, formed over the semiconductor substrate and extending along a third direction intersected with the first and second directions.

In another aspect of the present disclosure, a manufacturing method of a semiconductor device is provided. The method comprises: providing a semiconductor substrate with active regions and a trench isolation structure, wherein the active regions extend along a first direction, and the trench isolation structure spreads between the active regions; forming initial gate trenches at a top surface of the semiconductor substrate, wherein the initial gate trenches extend through the active regions and the trench isolation structure along a second direction intersected with the first direction; forming insulating lining layers on sidewalls of the initial gate trenches; further extending the initial gate trenches downwardly into the semiconductor substrate by an etching process using the insulating lining layers as masks, so as to form gate trenches; performing a first oxidation process to oxidize exposed surfaces of portions of the gate trenches within the active regions, so as to form sacrificial layers; removing the insulating lining layers and the sacrificial layers; and filling a conductive material into the gate trenches, in order to form word lines.

As above, portions of the word lines within the active regions respectively have a thick bottom part and a narrow top part. On the other hand, other portions of the word lines within a trench isolation structure spreading between the active regions merely have the narrow portions. Therefore, top ends of the word lines have a narrow dimension, thus top regions of the active regions are less occupied by the word lines and the overlying insulating material extending from the top ends of the word lines to a top surface of the substrate. Accordingly, contact area between the active regions and capacitor contacts formed thereon can be increased. In addition, by using such configuration for increasing the contact area of the active regions may prevent from compromising isolation of the active regions from the adjacent word lines extending in between the active regions. Further, since the word lines have the thick bottom portions, the word line can still be promised with a low resistivity.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 3A through FIG. 3J are schematic cross-sectional views taken across structures at various stages during the manufacturing process shown in FIG. 2 along a first direction.

FIG. 4A through FIG. 4J are schematic cross-sectional views taken across structures at various stages during the manufacturing process shown in FIG. 2 along a second direction.

DESCRIPTION OF THE EMBODIMENTS

Figure 1A:
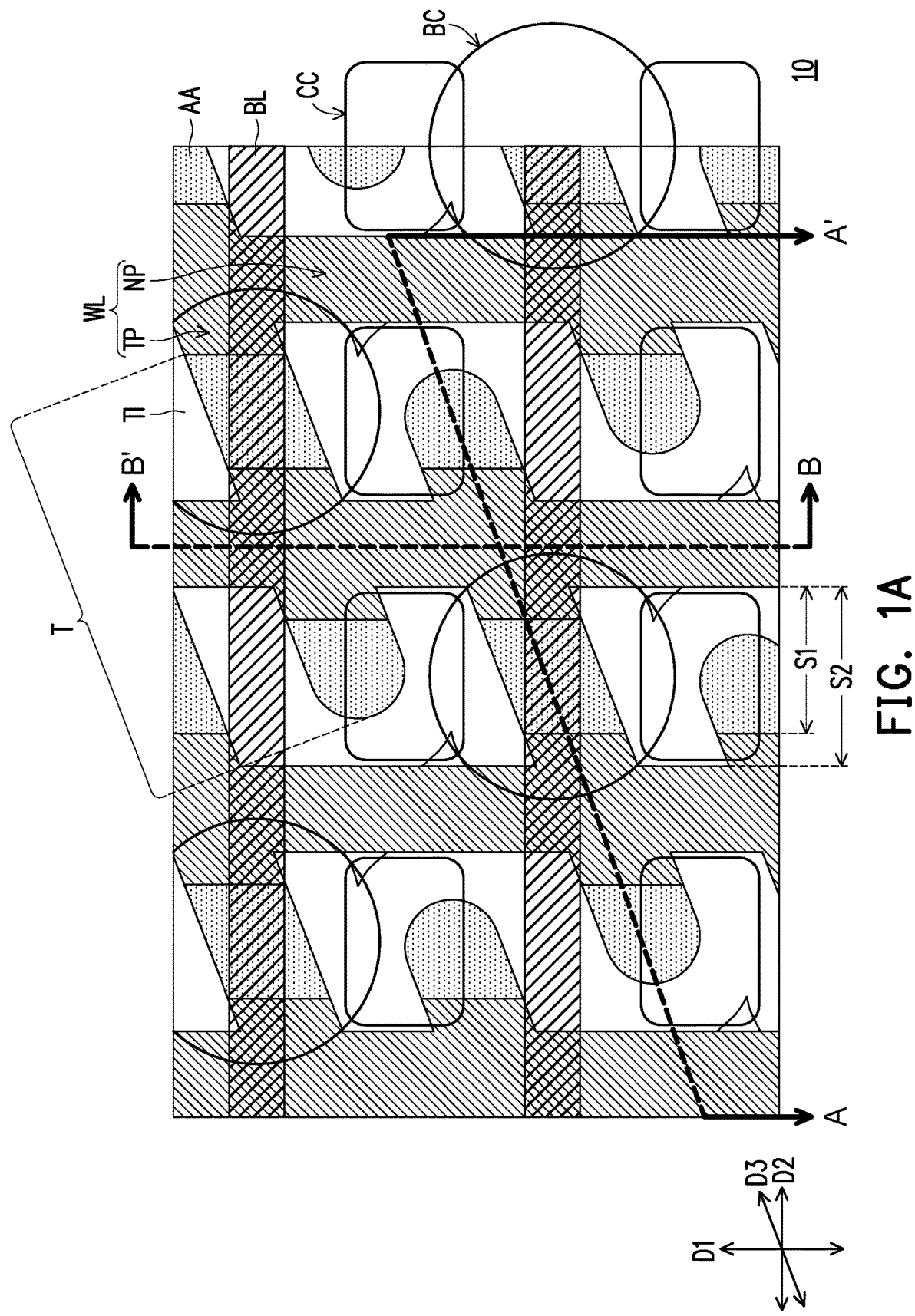
FIG. 1A is a schematic plane view illustrating a semiconductor device according to some embodiments of the present disclosure.
Figure 1C:
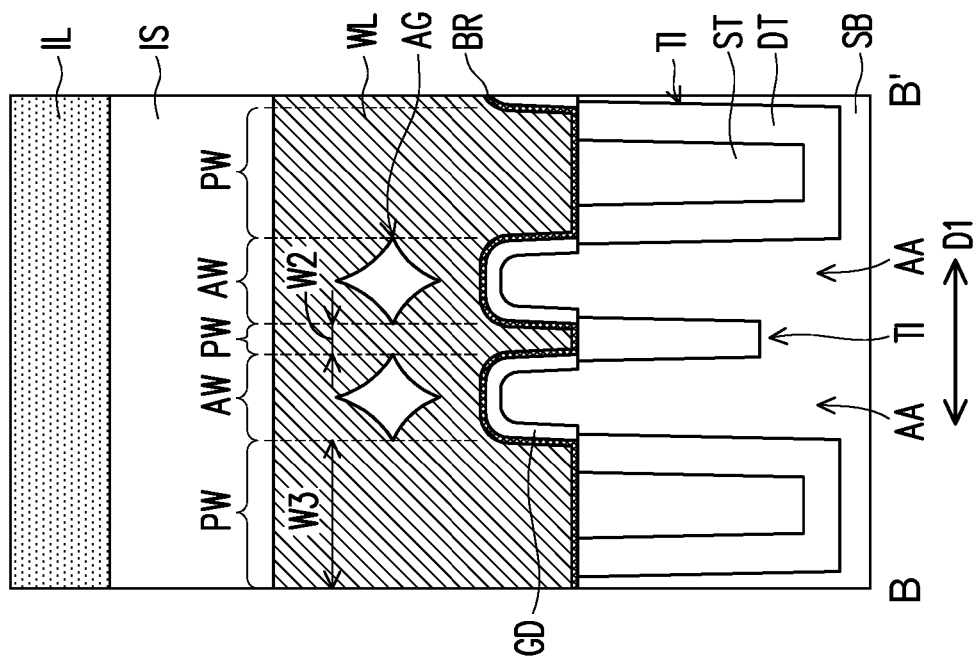
FIG. 1C is a schematic cross-sectional view along a B-B' line shown in FIG. 1A.
Figure 1B:
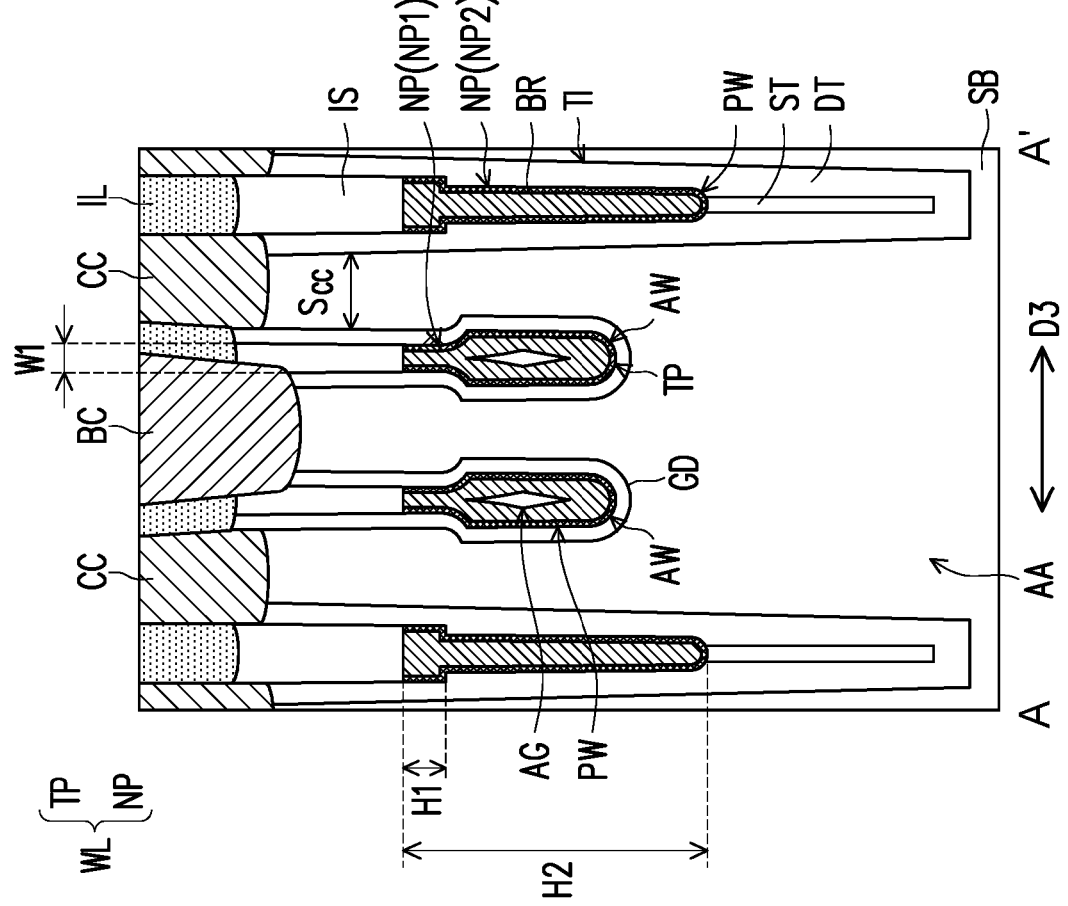
FIG. 1B is a schematic cross-sectional view along an A-A' line shown in FIG. 1A.

FIG. 1A is a schematic plane view illustrating a semiconductor device 10 according to some embodiments of the present disclosure. FIG. 1B is a schematic cross-sectional view along an A-A' line shown in FIG. 1A. FIG. 1C is a schematic cross-sectional view along a B-B's line shown in FIG. 1A. It should be noted that, for conciseness, some of the components shown in FIG. 1B and FIG. 1C are omitted from illustration in FIG. 1A.

Referring to FIG. 1A, in some embodiments, the semiconductor device 10 is a dynamic random access memory (DRAM) device. In these embodiments, the semiconductor device 10 includes word lines WL, bit lines BL and transistors T. The word lines WL are extending along a direction D1, whereas the bit lines BL are extending along a direction D2 intersected with the direction D1. Each of the transistors T is electrically connected to one of the word lines WL and one of the bit lines BL, and further in electrical contact with a storage capacitor (not shown). Each storage capacitor (not shown) and the transistor T connected thereto collectively form a memory cell. In some embodiments, a gate terminal of each transistor T is a portion of the corresponding word line WL. In addition, one of source and drain terminals of each transistor T is electrically connected to the corresponding bit line BL through a bit line contact BC, and the other of the source and drain terminals of each transistor T is electrically connected to the storage capacitor (not shown) through a capacitor contact CC. In some embodiments, the source and drain terminals of each transistor T are shallow portions in an active region AA, which is a doped region formed in a semiconductor substrate SB (as shown in FIG. 1B and FIG. 1C). The active regions AA are extending along a direction D3 intersected with the direction D1 and the direction D2. In certain embodiments, each of the active regions AA is shared by two of the transistors T, and is intersected with two of the word lines WL and one of the bit lines BL. A portion of each active region AA between the corresponding word lines WL may be functioned as a common source terminal or a common drain terminal, and is electrically connected to one of the bit lines BL through the bit line contact BC in between. On the other hand, portions of each active region AA at opposite sides of the corresponding bit line contact BC are electrically connected to two of the storage capacitors (not shown) through the capacitor contacts CC in between. In some embodiments, the bit line contacts BC are formed as having circular top view shapes, and the capacitor contacts CC are formed as having rectangular top view shapes. In addition, each of the bit line contacts BC may have a footprint area greater than a footprint area of each capacitor contact CC. However, those skilled in the art may modify shape and dimension of the bit line contacts BC and the capacitor contacts CC according to design requirements, the present disclosure is not limited thereto.

Referring to FIG. 1A, each word line WL has a narrow portion NP and a plurality of thick portions TP. The thick portions TP are spaced apart from one another. The narrow portion NP continuously extends along the direction D1, and the thick portions TP are covered by the continuously extending narrow portion NP. The thick portions TP are disposed at where the word line WL is intersected with the corresponding active regions AA. A lateral spacing S1 between the thick portions TP of one of the word lines WL and the narrow portion NP of an adjacent one of the word lines WL is shorter than a lateral spacing S2 between the narrow portion NP of the one of the word lines WL and the narrow portion NP of the adjacent one of the word lines WL. In some embodiments, each of the thick portions TP may be spreading outwardly from a central axis of the corresponding word line WL along an extending direction of the corresponding active region AA (i.e., the direction D3). In these embodiments, some sides of each thick portion TP (e.g., long sides of each thick portion TP) may be substantially coplanar with a contour of the corresponding active region AA. Moreover, in some embodiments, sections of the narrow portion NP of each word line WL extending between the active regions AA have two different lengths, and these sections having two different lengths are arranged alternately along the direction D1.

Referring to FIG. 1A and FIG. 1B, the word lines WL are buried in a semiconductor substrate SB, and may be spaced apart from a top surface of the semiconductor substrate SB by insulating materials IS. Sections of the narrow portion NP of each word line WL that are overlapped with the thick portions TP have a height H1 much less than a height H2 of sections of the narrow portion NP not overlapped with the thick portions TP. In other words, shorter sections of the narrow portion NP (also labeled as narrow portions NP1 in FIG. 1B) are lying over the thick portions TP, whereas taller sections of the narrow portion NP (also labeled as narrow portions NP2 in FIG. 1B) are extending between the thick portions TP (as illustrated in FIG. 1A). In some embodiments, the taller sections of the narrow portion NP (i.e., the narrow portions NP2) as well as the overlying insulating material IS are extending in a trench isolation structure TI formed in the semiconductor substrate SB. As shown in FIG. 1A, the trench isolation structure TI spreads between the active regions AA. On the other hand, the thick portions TP, the shorter sections of the narrow portions NP (i.e., the narrow portions NP1) and the overlying insulating materials IS are extending within the active regions AA. Each thick portion TP and the overlying shorter section of the narrow portion NP (i.e., the narrow portion NP1) may be referred as an active word line AW as reasons of being formed within the active region AA and being part of a transistor T. On the other hand, each taller section of the narrow portion NP (i.e., the narrow portion NP2) may be referred as a passive word line PW as a reason of being formed within the trench isolation structure TI. The active word lines AW are in contact with the active regions AA through gate dielectric layers GD. In some embodiments, the gate dielectric layers GD further cover sidewalls of the insulating materials IS standing on the active word lines AW. During a manufacturing process for forming the semiconductor device 10, air gaps AG may be formed in the active word lines AW, and will be further described with reference to FIG. 3I. In addition, in some embodiments, top surfaces of the active word lines AW and the passive word lines PW are substantially coplanar with one another, whereas bottom ends of the active word lines AW may be higher than bottom ends of the passive word lines PW.

As shown in FIG. 1B, each of the bit line contacts BC is formed on a top portion of the corresponding active region AA spreading between and over two active word lines AW, and may further extend into this top portion of the corresponding active region AA and the insulating materials IS standing on these active word lines AW. In addition, each of the capacitor contacts CC is formed on a top portion of the corresponding active region AA spreading between and above one of the active word lines AW and one of the passive word lines PW, and may further extends into this top portion of the corresponding active region AA and a top portion of the trench isolation structure TI in which the passive word line PW is located. In some embodiments, the bit line contacts BC and the capacitor contacts CC are laterally isolated from one another by one or more insulating layers IL formed over the semiconductor substrate SB. A footprint area of the top portion of an active region AA on which the corresponding capacitor contact CC lies is determined by a spacing $S_{CC}$ between the insulating material IS standing on a top portion of an active word line AW and an adjacent portion of the trench isolation structure TI in which a passive word line PW is disposed. This insulating material IS has a width W1 substantially identical to or slightly greater than a width of the top portion of the active word line AW (i.e., a width of the narrow portion NP of the word line WL along the direction D3), rather than a width of a bottom portion of the active word line AW (i.e., a width of the thick portion TP of the word line WL along the direction D3). Accordingly, as compared to forming the active word line AW as only including the thick portion TP, the insulating material IS standing on the narrow portion NP of the active word line AW according to embodiments of the present disclosure can be laterally spaced apart from an adjacent portion of the trench isolation structure TI by a greater spacing (i.e., the spacing $S_{CC}$). Therefore, the top portion of the active region AA on which the corresponding capacitor contact CC lies can have a greater footprint area, and a contact area between this top portion of the active region AA and the corresponding capacitor contact CC can be increased. As a result, contact resistance between the active region AA and the corresponding capacitor contact CC can be reduced. Moreover, as compared to increasing the contact area between the top portion of the active region AA and the corresponding capacitor contact CC by simply reducing a footprint area of the trench isolation structure TI, forming the active word line AW as having top narrow portion NP and bottom thick portion TP according to embodiments of the present disclosure can increase the contact area between the top portion of the active region AA and the corresponding capacitor contact CC without compromising isolation between the passive word line PW (located within the trench isolation structure TI) and an adjacent active region AA. Furthermore, as compared to increasing the contact area between the top portion of the active region AA and the corresponding capacitor contact CC by forming the active word line AW as only having the narrow portion NP (as similar to the passive word line PW), forming the active word line AW as having top narrow portion NP and bottom thick portion TP according to embodiments of the present disclosure can increase the contact area between the top portion of the active region AA and the corresponding capacitor contact CC while promising a low resistivity of the active word line AW.

Referring to FIG. 1A and FIG. 1C, the active word lines AW and the passive word lines PW are alternately arranged along the extending direction of the word lines WL (i.e., the direction D1). In some embodiments, some of the passive word lines PW respectively between closely adjacent active word lines AW have a width W2 much less than a width W3 of another passive word line PW between loosely adjacent active word lines AW. Similarly, portions of the trench isolation structure TI respectively between closely adjacent active word lines AW have a width much less than a width of another portion of the trench isolation structure TI between loosely adjacent active word lines AW. In some embodiments, those portions of the trench isolation structure TI with the smaller width may have a depth less than a depth of those portions of the trench isolation structure TI with the greater width. In addition, in some embodiments, those portions of the trench isolation structure TI with the greater width respectively include a deep trench isolation DT and a shallow trench isolation ST formed in the deep trench isolation DT. In these embodiments, a bottom surface and a sidewall of the shallow trench isolation ST is covered by the deep trench isolation DT, and the deep trench isolation DT and the shallow trench isolation ST are made of different insulating materials, such as silicon oxide and silicon nitride.

Figure 2:
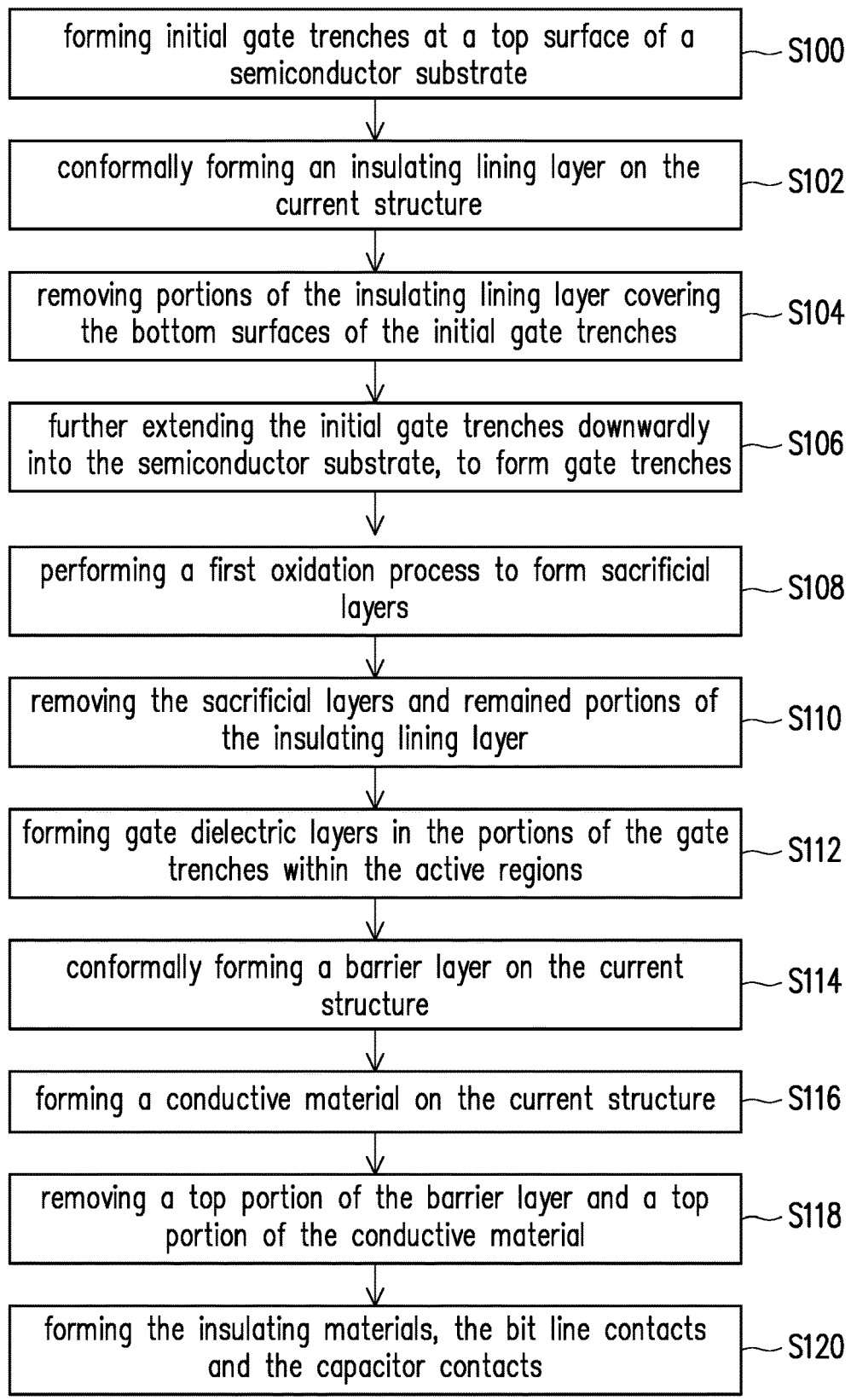
FIG. 2 is a flow diagram of a manufacturing method of the semiconductor device shown in FIG. 1A.

FIG. 2 is a flow diagram of a manufacturing method of the semiconductor device shown in FIG. 1A. FIG. 3A through FIG. 3J are schematic cross-sectional views taken across structures at various stages during the manufacturing process shown in FIG. 2 along the A-A' line. FIG. 4A through FIG. 4J are schematic cross-sectional views taken across structures at various stages during the manufacturing process shown in FIG. 2 along the B-B' line.

Figure 4A:
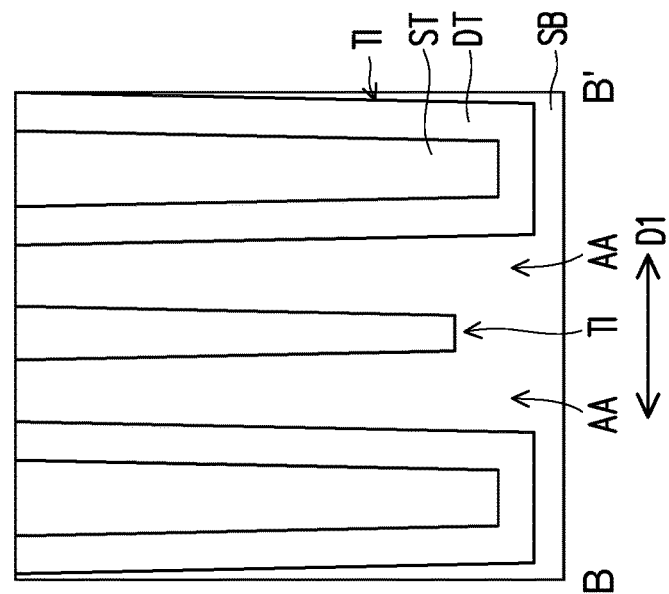
Figure 3A:
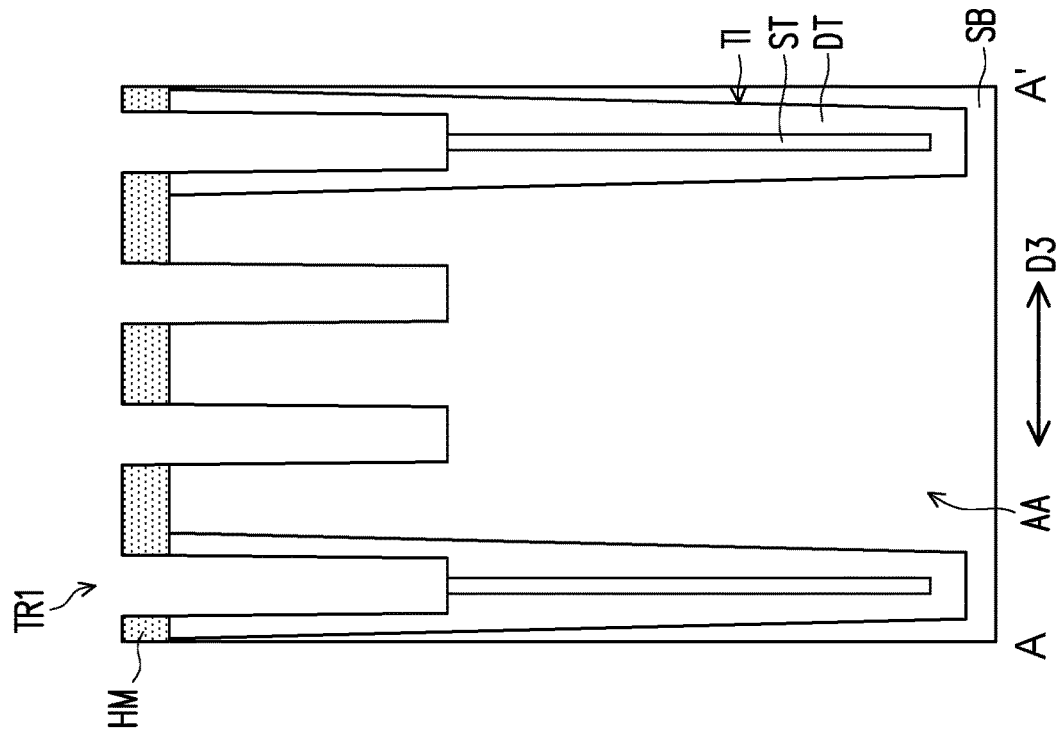

Referring to FIG. 2, FIG. 3A and FIG. 4A, step S100 is performed, and initial gate trenches TR1 are formed at a top surface of the semiconductor substrate SB. The semiconductor substrate SB is provided with the active regions AA and the trench isolation structure TI surrounding each of the active regions AA. As shown in FIG. 4A, each initial gate trench TR1 is passing through the active regions AA and the trench isolation structure TI along the direction D1. In addition, a depth of each initial gate trench TR1 is substantially constant along its extending direction (i.e., the direction D1). As shown in FIG. 3A, some portions of each initial gate trench TR1 are formed in those portions of the trench isolation structure TI that respectively include the deep trench isolation DT and the shallow trench isolation ST. During formation of the initial gate trenches TR1, a top portion of each shallow trench isolation ST as well as a surrounding portion of the corresponding deep trench isolation DT are removed. On the other hand, other portions of each initial gate trench TR1 are formed in the active regions AA, and extending into the active region AA from top surfaces of the active regions AA. In some embodiments, a hard mask pattern HM having openings for defining the initial gate trenches TR1 is formed on the semiconductor substrate SB before performing an etching process for forming the initial gate trenches TR1.

Figure 4B:
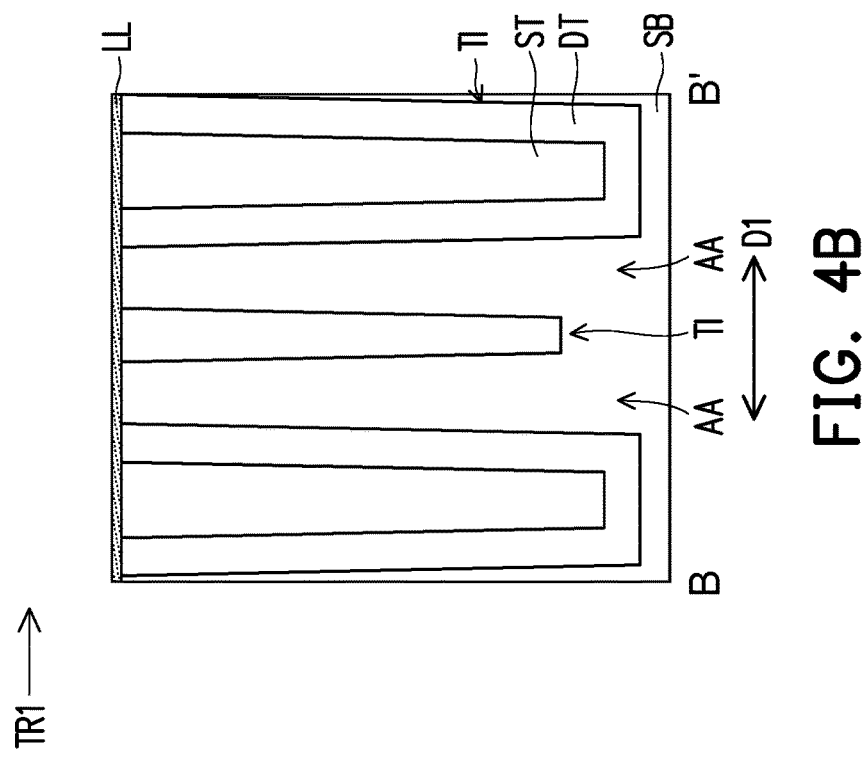
Figure 3B:
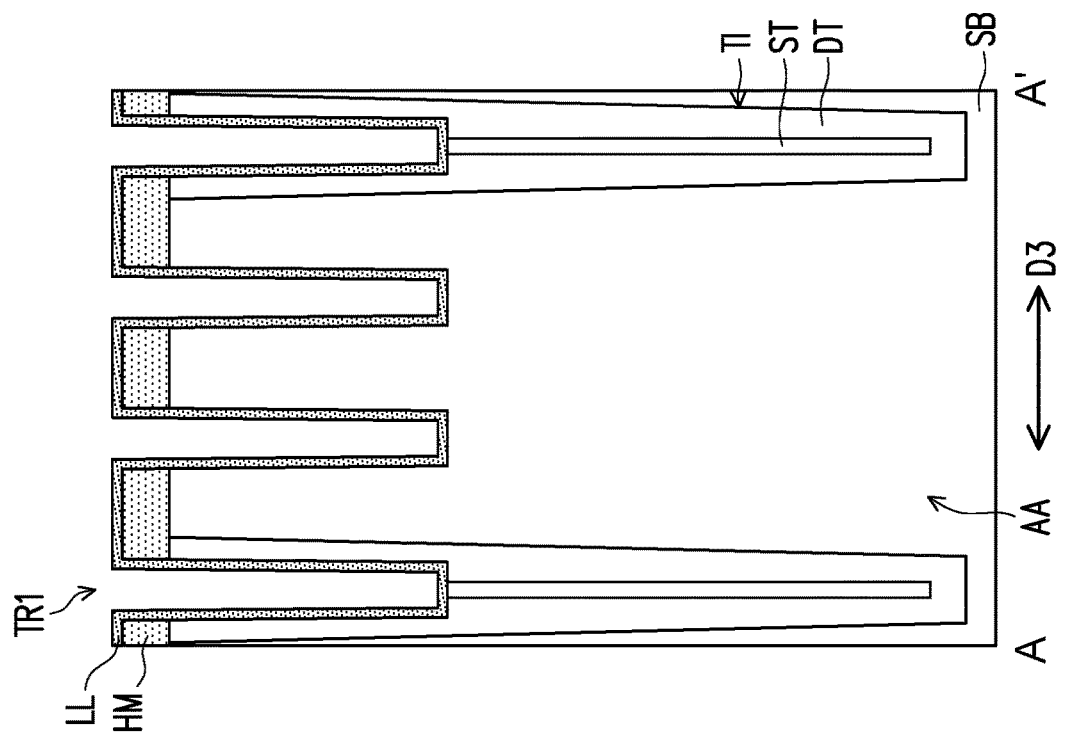

Referring to FIG. 2, FIG. 3B and FIG. 4B, step S102 is performed, and an insulating lining layer LL is conformally formed on the current structure. In some embodiments, the insulating lining layer LL is globally covering the current structure. In this way, a top surface and sidewalls of the hard mask pattern HM as well as bottom surfaces and sidewalls of the initial gate trenches TR1 are covered by the insulating lining layer LL. A material of the insulating lining layer LL may include silicon oxide, silicon nitride, silicon oxynitride, the like or combinations thereof.

Figure 4C:
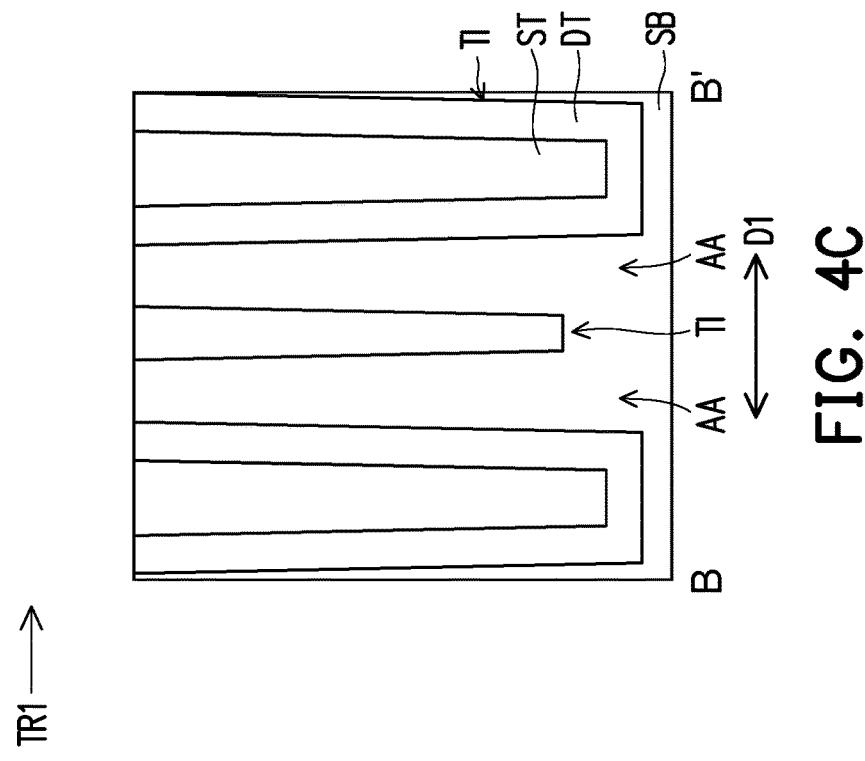
Figure 3C:
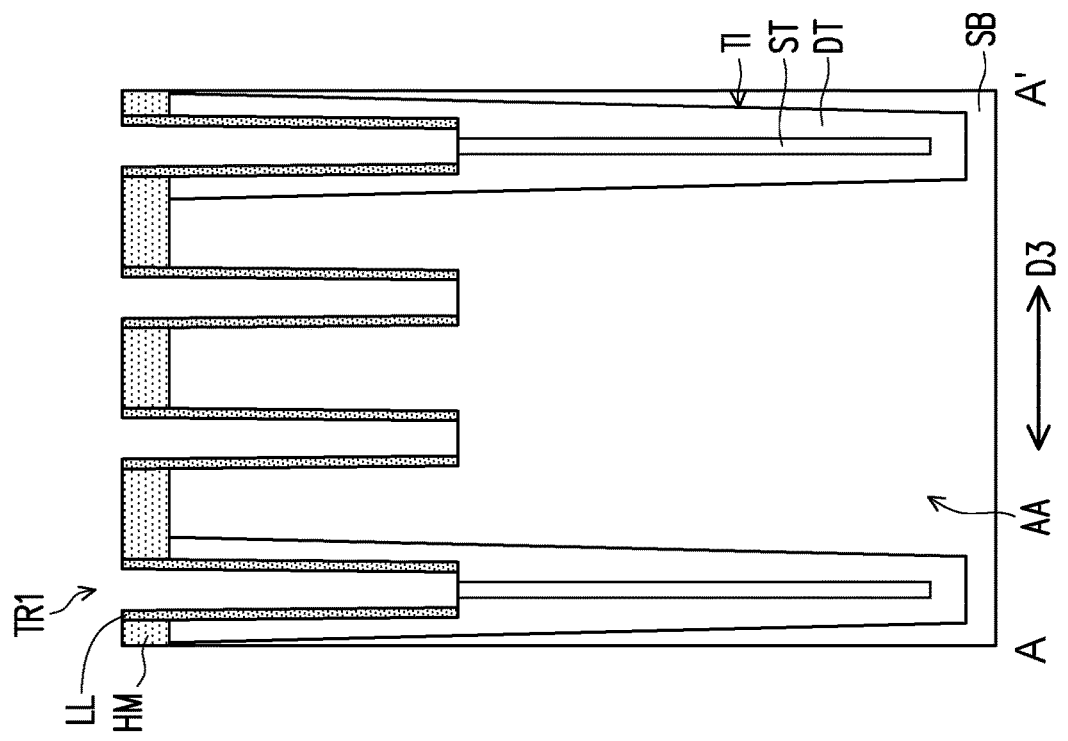

Referring to FIG. 2, FIG. 3C and FIG. 4C, step S104 is performed, and portions of the insulating lining layer LL covering the bottom surfaces of the initial gate trenches TR1 are removed. In some embodiments, portions of the insulating lining layer LL covering the top surface of the hard mask pattern HM are removed along with the portions of the insulating lining layer LL covering the bottom surfaces of the initial gate trenches TR1. On the other hand, portions of the insulating lining layer LL covering sidewalls of the initial gate trenches TR1 and the hard mask pattern HM are remained. In other words, laterally lying portions of the insulating lining layer LL are removed, whereas standing portions of the insulating lining layer LL are remained. A method for removing these laterally lying portions of the insulating lining layer LL may include an anisotropic etching process.

Figure 4D:
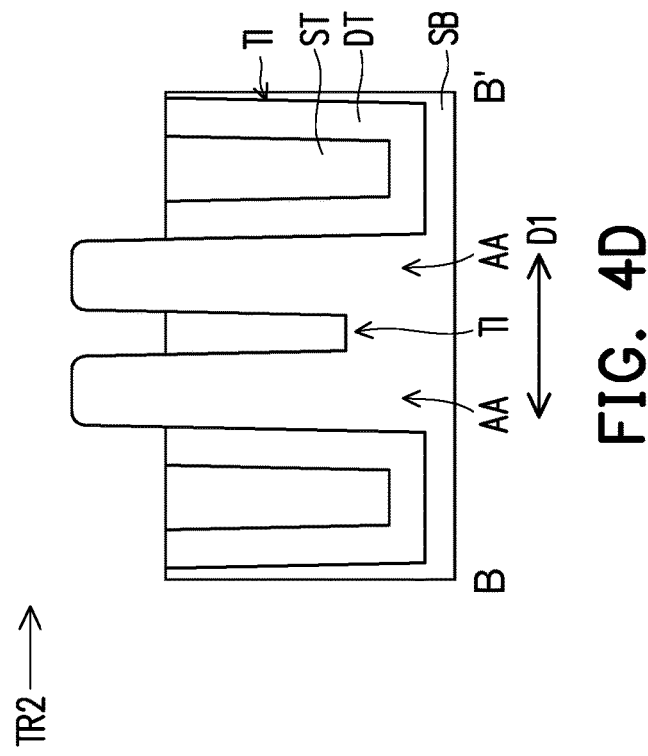
Figure 3D:
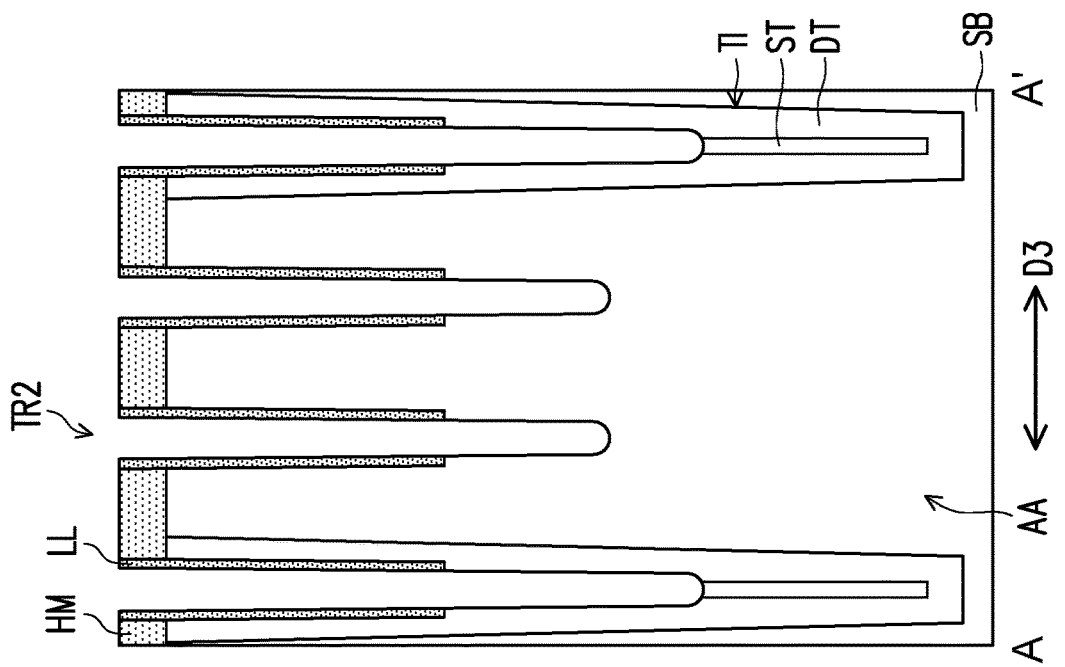

Referring to FIG. 2, FIG. 3D and FIG. 4D, step S106 is performed, and the initial gate trenches TR1 are further extended downwardly into the semiconductor substrate SB, in order to form gate trenches TR2. A method for forming the gate trenches TR2 may include etching the structure lying under the initial gate trenches TR1 by using the remained standing portions of the insulating lining layer LL as well as the hard mask pattern HM as a shadow mask. For instance, the etching process may be an anisotropic etching process. Some of the gate trenches TR2 within the trench isolation structure TI may have a depth greater than a depth of other gate trenches TR2 within the active regions AA, and this may be resulted from etching selectivity between material(s) of the trench isolation structure TI and a material of the semiconductor substrate SB. In other words, during formation of the gate trenches TR2, an etching rate of the trench isolation structure TI may be greater than an etching rate of the active regions AA. As shown in FIG. 3D, the remained standing portions of the insulating lining layer LL cover top sidewalls of the gate trenches TR2, and bottom surfaces as well as bottom sidewalls of the gate trenches TR2 are currently exposed. As shown in FIG. 4D, portions of a bottom surface of each gate trench TR2 within the active regions AA are higher than portions of the bottom surface of each gate trench TR2 in the trench isolation structure TI. That is, each gate trench TR2 has an uneven bottom surface.

Figure 4E:
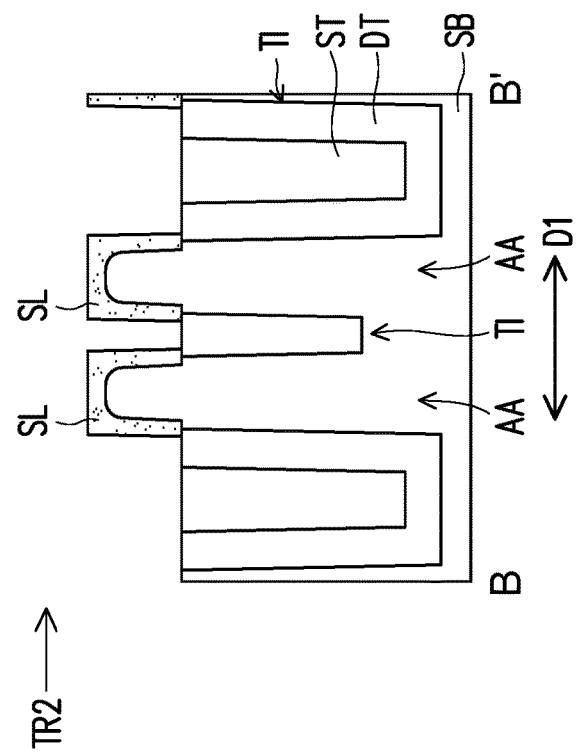
Figure 3E:
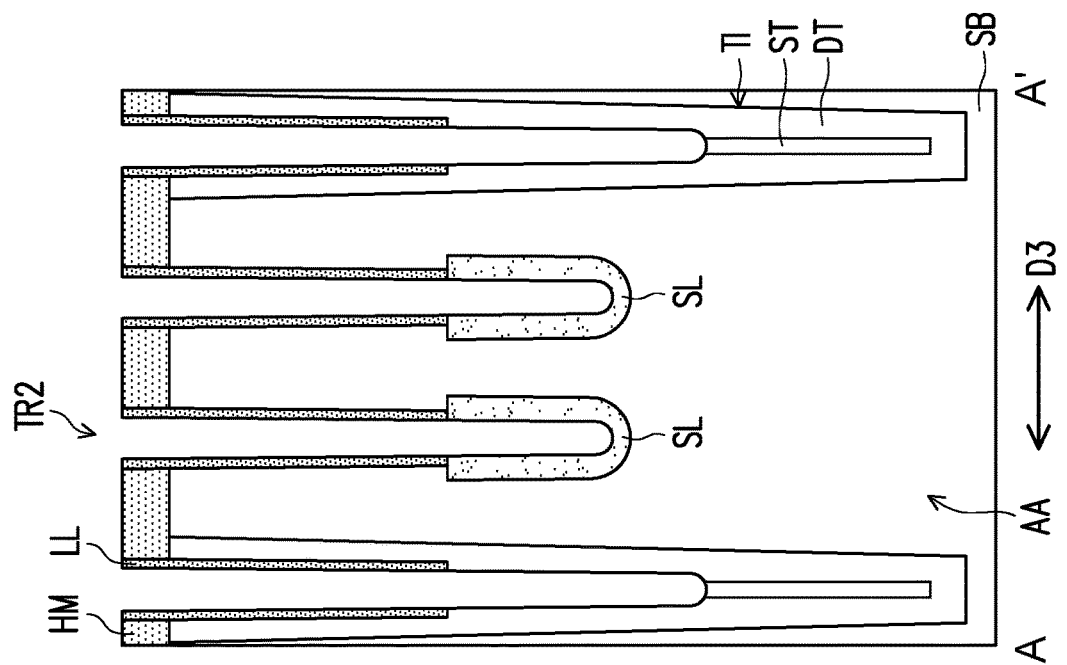

Referring to FIG. 2, FIG. 3E and FIG. 4E, step S108 is performed, and an oxidation process is performed. During the oxidation process, exposed portions of the semiconductor substrate SB in the gate trenches TR2 are oxidized to form sacrificial layers SL, whereas the exposed portions of the trench isolation structure TI and the insulating lining layer LL in the gate trenches TR2 along with a top surface of the hard mask pattern HM may not be oxidized. In this way, the sacrificial layers SL are extending into the semiconductor substrate SB from the bottom sidewalls of portions of the gate trenches TR2 formed within the active regions AA. In some embodiments, a thickness the sacrificial layers SL is greater than a thickness of the insulating lining layer LL, thus the bottom parts of these portions of the gate trenches TR2 within the active regions AA can be wider than top parts of these portions of the gate trenches TR2 after the sacrificial layers SL and the insulating lining layer LL are removed. In addition, in some embodiments, the oxidation process may be a plasma oxidation process, and process temperature of the plasma oxidation process may range from 450° C. to 700° C.

Figure 4F:
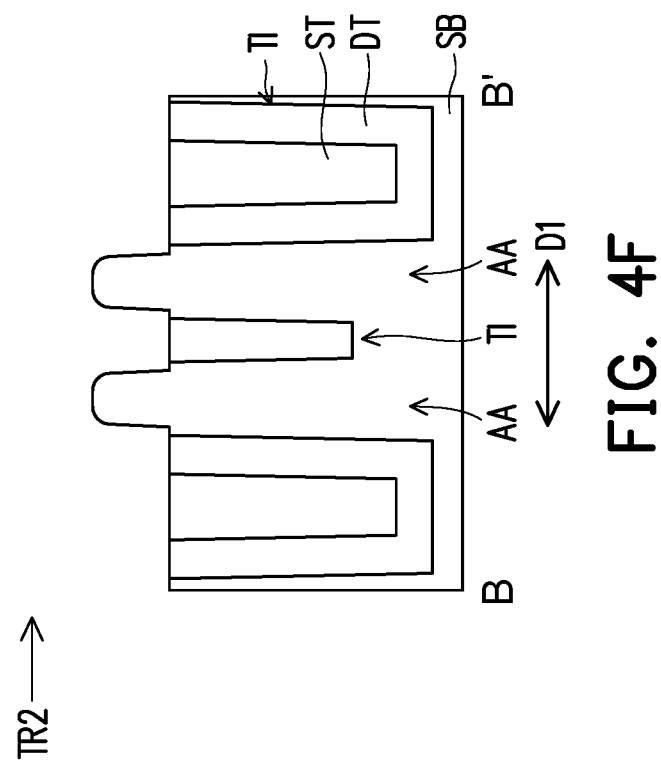
Figure 3F:
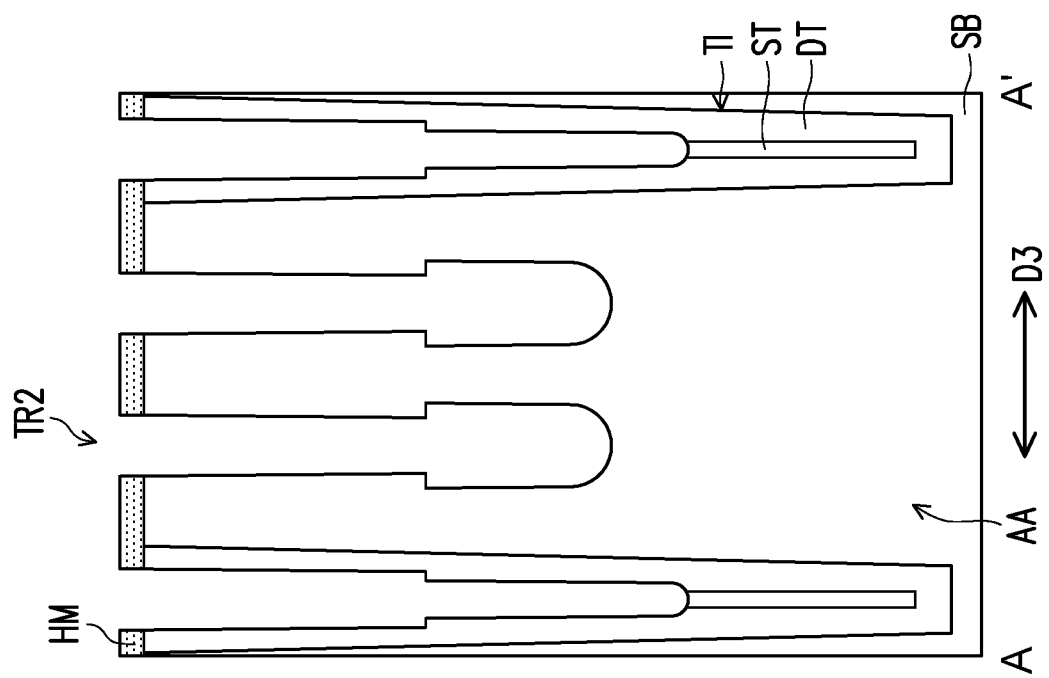

Referring to FIG. 2, FIG. 3F and FIG. 4F, step S110 is performed, and the sacrificial layers SL as well as the remained portions of the insulating lining layer LL are removed. After removal of the insulating lining layer LL, portions of the gate trenches TR2 within the trench isolation structure TI respectively have a bottom part and a top part slightly wider than the bottom part. On the other hand, after removal of the insulating linin layer LL and the sacrificial layers SL, portions of the gate trenches TR2 within the active regions AA respectively have a top part and a bottom part wider than the top portion. In some embodiments, the sacrificial layers SL and the remained portions of the insulating lining layer LL are removed by an isotropic etching process. During such isotropic etching process, the previously exposed portions of the trench isolation structure TI may not be removed because of an etching selectivity of the material(s) of the trench isolation structure TI with respect to material(s) of the sacrificial layers SL and the insulating lining layer LL.

Figure 4G:
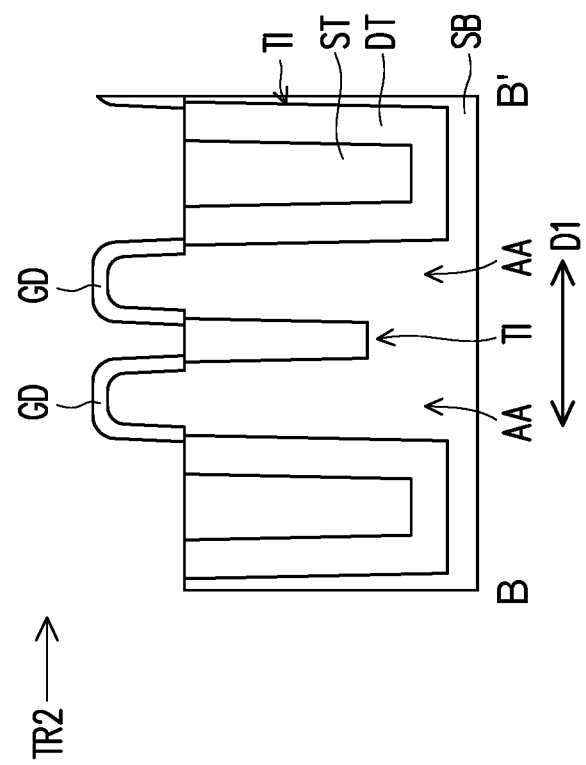
Figure 3G:
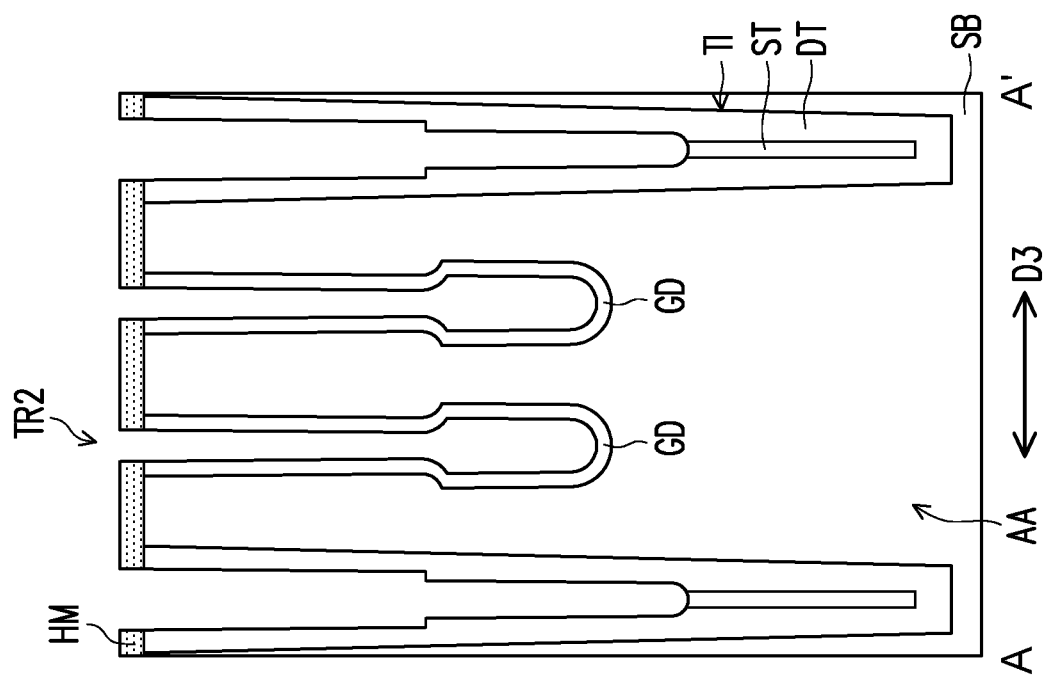

Referring to FIG. 2, FIG. 3G and FIG. 4G, step S112 is performed, and the gate dielectric layers GD are formed in the portions of the gate trenches TR2 within the active regions AA. In some embodiments, portions of the semiconductor substrate SB exposed in the portions of the gate trenches TR2 within the active regions AA are oxidized, and shallow regions of the exposed portions of the semiconductor substrate SB are oxidized to form the gate dielectric layer GD. On the other hand, as a result of material difference, exposed portions of the trench isolation structure TI as well as the hard mask pattern HM may not be oxidized, and may remain unchanged. For instance, the oxidation process may include an in situ steam generation (ISSG) process.

Figure 4H:
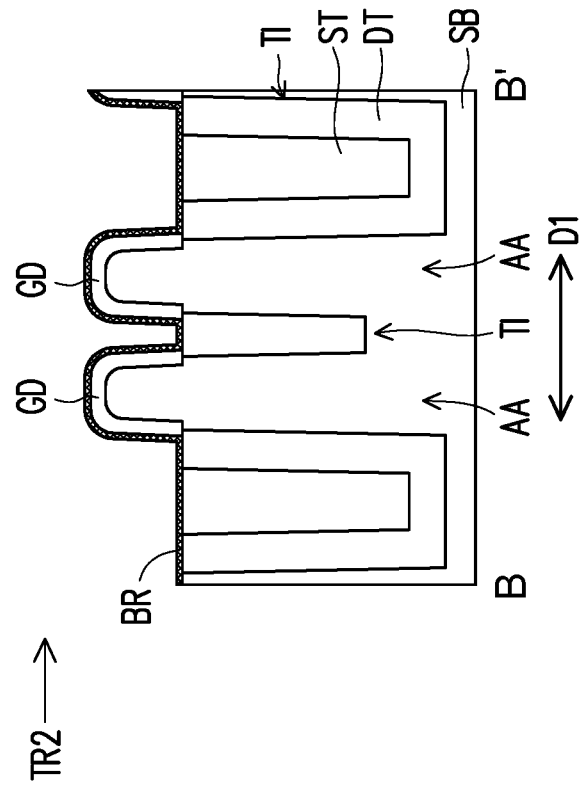
Figure 3H:
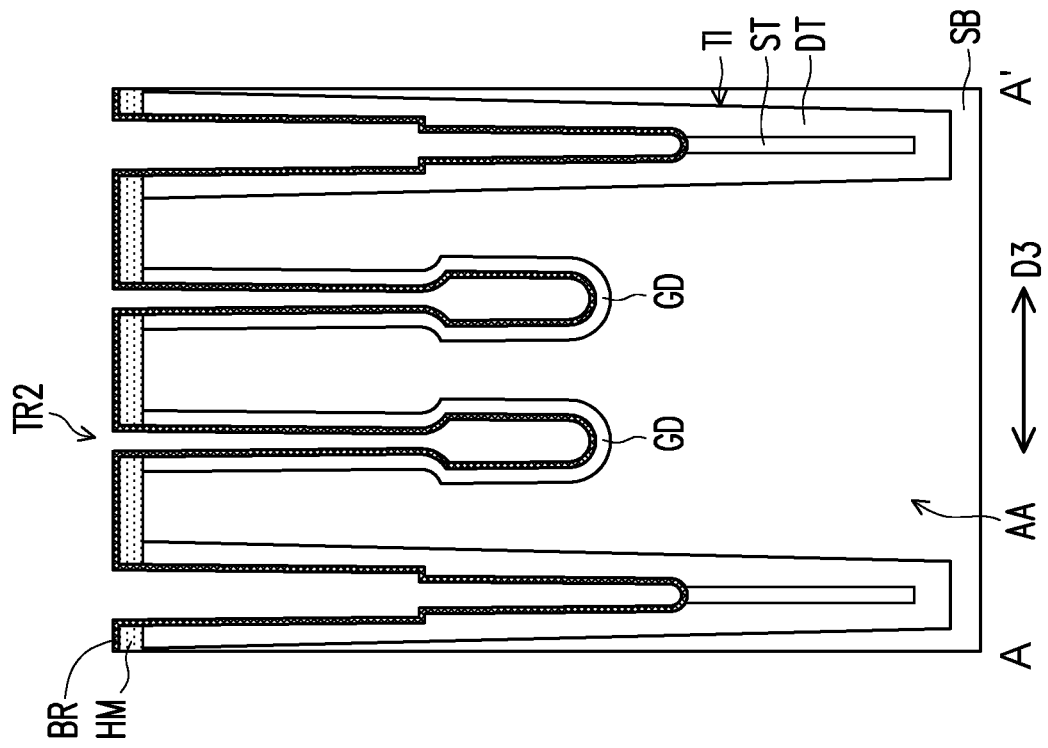

Referring to FIG. 2, FIG. 3H and FIG. 4H, step S114 is performed, and a barrier layer BR is conformally formed on the current structure. In some embodiments, the barrier layer BR is globally covering the current structure. In this way, the exposed surfaces of the gate dielectric layers GD, the trench isolation structure TI and the hard mask pattern HM are covered by the barrier layer BR. The barrier layer BR is made of a conductive material (e.g., TiN).

Figure 4I:
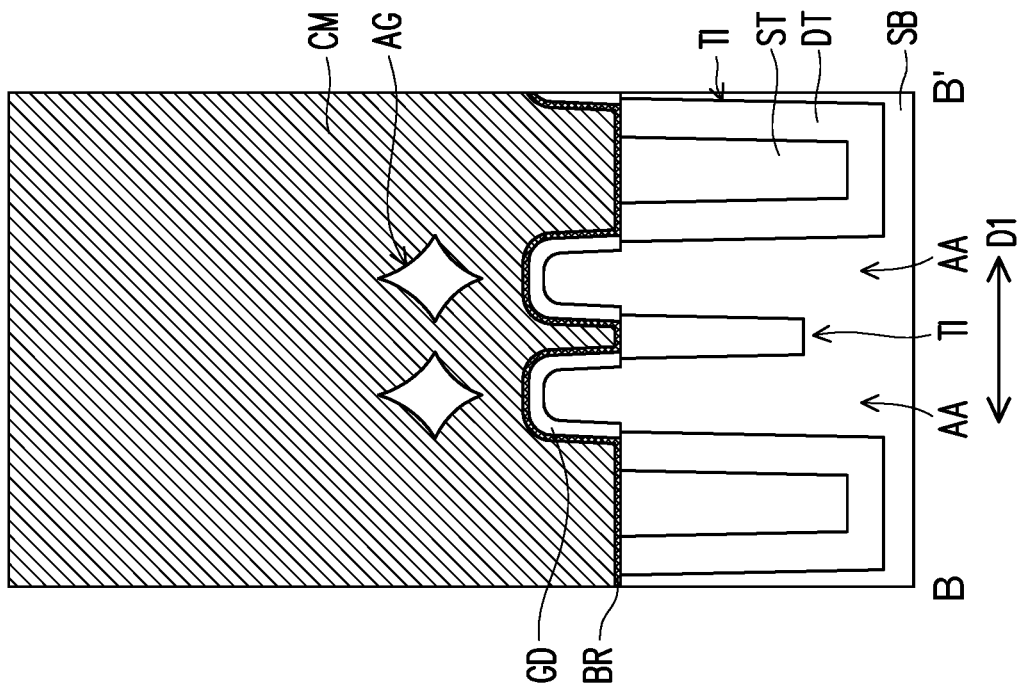
Figure 3I:
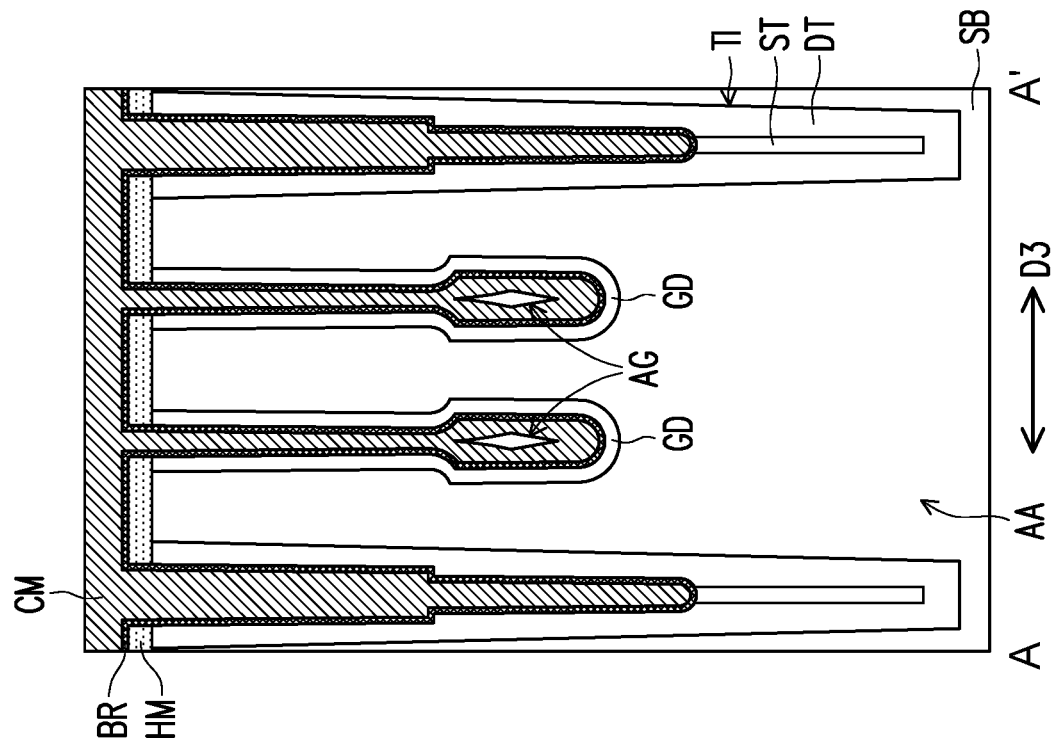

Referring to FIG. 2, FIG. 3I and FIG. 4I, step S116 is performed, and a conductive material CM is formed on the current structure. The conductive material CM fills the gate trenches TR2, and may further extend onto a topmost surface of the barrier layer BR. In some embodiments, during formation of the conductive material CM, the air gaps AG may be formed in the portions of the gate trenches TR2 within the active regions AA. In these embodiments, the air gaps AG may be located in the lower parts (i.e., wider parts) of these portions of the gate trenches TR2. In alternative embodiments, the conductive material CM may be formed without an air gap. A material of the conductive material CM may include, for example, tungsten.

Referring to FIG. 2, FIG. 3J and FIG. 4J, step S118 is performed, and a top portion of the barrier layer BR and a top portion of the conductive material CM are removed. After removal of the top portions of the barrier layer BR and the conductive material CM, the top surface and the sidewalls of the hard mask pattern HM, top sidewalls of the trench isolation structure TI and top sidewalls of the gate dielectric layers GD are exposed, and the remained portions of the barrier layer BR and the conductive material CM collectively form the word lines WL. Top surfaces of the word lines WL may be substantially coplanar with one another, and are above the lower parts (i.e., the wider parts) of the portions of the gate trenches TR2 within the active regions AA, and lower than a top surface of the semiconductor substrate SB. As described with reference to FIG. 1A and FIG. 1B, portions of the word lines WL formed within the active regions AA are referred as active word lines AW, whereas portions of the word lines WL formed in the trench isolation structure TI are referred as passive word lines PW. In some embodiments, a method for removing the top portions of the barrier layer BR and the conductive material CM includes an etching back process.

Referring to FIG. 2, FIG. 1B and FIG. 1C, step S120 is performed, and the insulating materials IS, the bit line contacts BC and the capacitor contacts CC are formed. The insulating materials IS fill up the gate trenches TR, and the word lines WL are covered by the insulating materials IS. The bit line contacts BC respectively extend into a portion of one of the active regions AA between and above adjacent active word lines AW from above the semiconductor substrate SB. In some embodiments, each of the bit line contacts CC laterally extend to portions of adjacent insulating materials IS through portions of the gate dielectric layers GD. On the other hand, the capacitor contacts CC respectively extend into a portion of one of the active regions AA between and above adjacent active word line AW and passive word line PW from above the semiconductor substrate SB. The insulating materials IS may include, for example, silicon nitride, whereas materials of the bit line contacts BC and the capacitor contacts CC may include, for example, polysilicon.

In some embodiments, the hard mask pattern HM is removed, and the at least one insulating layer IL is formed over the semiconductor substrate SB for isolating the bit line contacts BC from the capacitor contacts CC. Afterwards, the bit lines BL (as shown in FIG. 1A) as well as storage capacitors (not shown) may be further formed on the current structure. Up to here, the semiconductor device 10 according with some embodiments of the present disclosure has been formed.

Figure 5B:
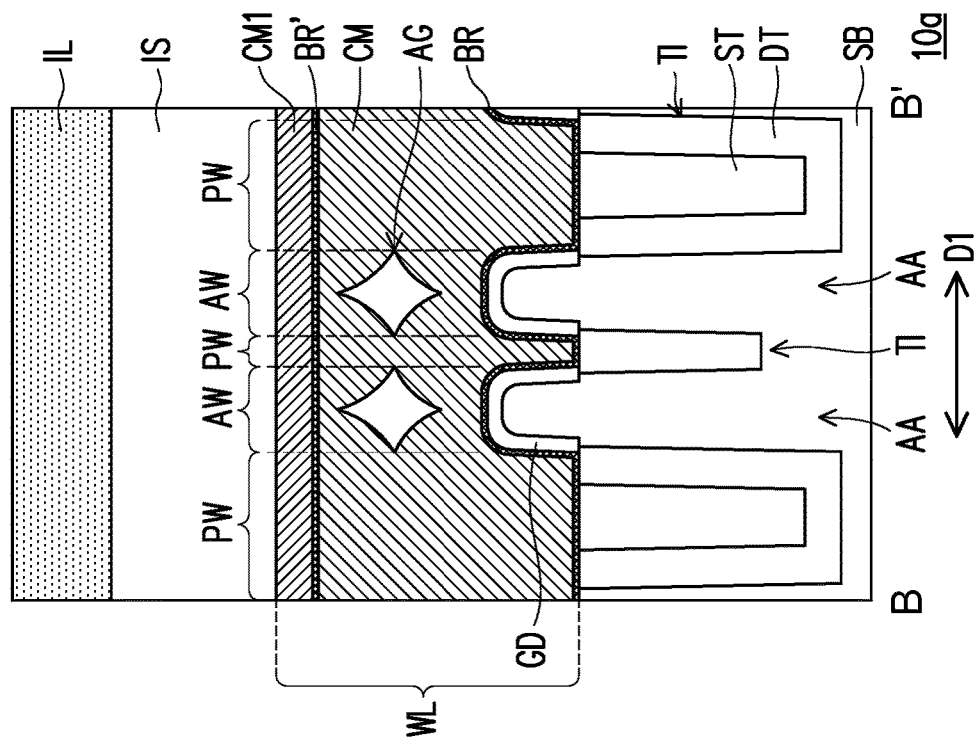
FIG. 5A and FIG. 5B are schematic cross-sectional views of a semiconductor device according to alternative embodiments of the present disclosure.
Figure 5A:
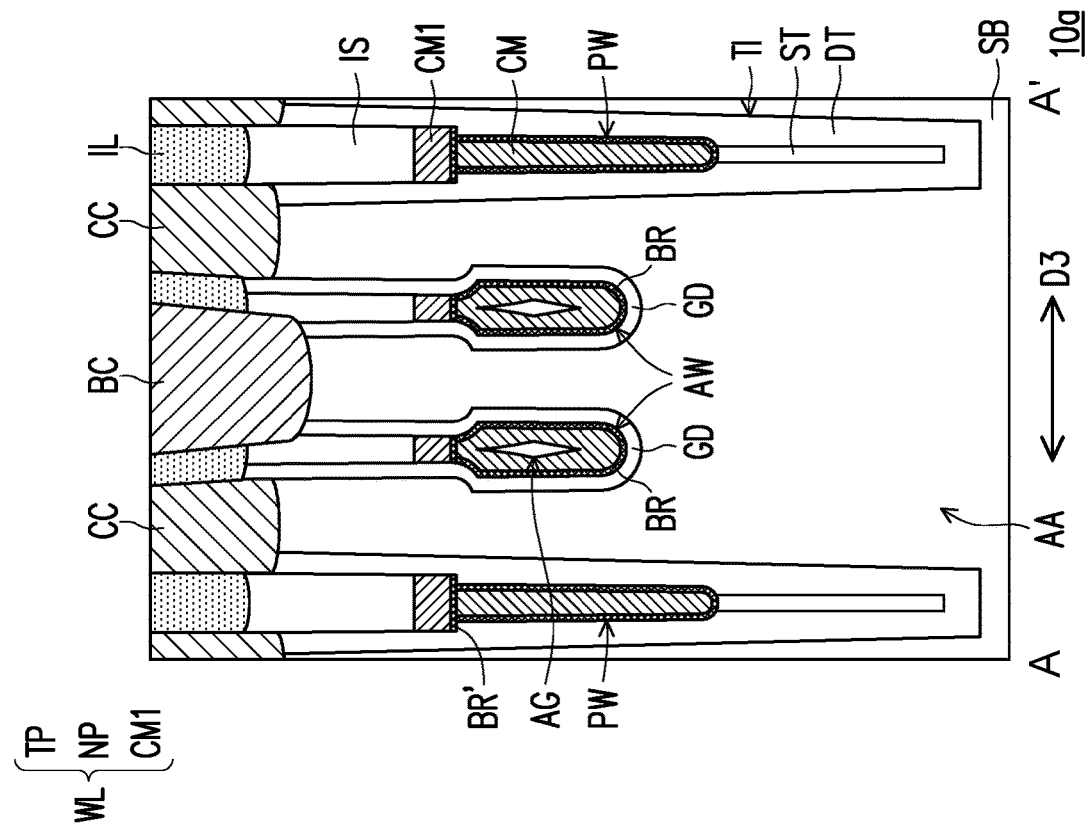

FIG. 5A is a schematic cross-sectional view (along the A-A' line) of a semiconductor device 10*a* according to alternative embodiments of the present disclosure. FIG. 5B is a schematic cross-sectional view (along the B-B' line) of the semiconductor device 10*a*. The semiconductor device 10*a* shown in FIG. 5A and FIG. 5B is similar to the semiconductor device 10 as described with reference to FIG. 1A through FIG. 1C. Only difference therebetween will be described, the same or the like parts will not be repeated again.

Referring to FIG. 5A and FIG. 5B, in some embodiments, each of the word lines WL is a dual work function word line. In these embodiments, each word line WL further includes an additional conductive material CM1 continuously extending on the narrow portion NP. A top part of the narrow portion NP of each word line WL is replaced by the additional conductive material CM1. The additional conductive material CM1 has work function different from work function of the material for forming the remainder portion of the word line WL (e.g., the conductive material CM and the barrier layer BR as described with reference to FIG. 3H, FIG. 3I, FIG. 4H and FIG. 4I). For instance, the work function of the additional conductive material CM1 may be lower than the work function of the conductive material CM and the work function of the barrier layer BR, and the additional conductive material CM1 may be made of n-type doped polysilicon (e.g., phosphorus doped polysilicon), whereas the conductive material CM may be made of tungsten. In order to form the word lines WL further having the additional conductive material CM1, more of the conductive material CM and the barrier layer BR are removed during the step S118 as described with reference to FIG. 3J and FIG. 4J, and the additional conductive material CM1 is subsequently form on the remainder portions of the conductive material CM and the barrier layer BR by a deposition process. An etch back process may or may not be performed after deposition of the additional conductive material CM1. In some embodiments, an additional barrier layer BR' is formed on the top surfaces of the barrier layer BR and the conductive material CM before formation of the conductive material CM1. In such embodiments, the barrier layer BR' is located between the conductive material CM1 and the underlying conductive material CM as well as the barrier layer BR. In addition, the barrier layers BR, BR' may be made of the same material or different materials, and may be formed by different methods. For instance, the barrier layer BR may be made of TiN and formed by a CVD process, while the barrier layer BR' may be made of TiN, Ti, or a combination of TiN and Ti, and formed by a PVD process.

As above, portions of the word lines within the active regions respectively have a thick bottom part and a narrow top part. On the other hand, other portions of the word lines within a trench isolation structure spreading between the active regions merely have the narrow portions. Therefore, top ends of the word lines have a narrow dimension, thus top regions of the active regions are less occupied by the word lines and the overlying insulating material extending from the top ends of the word lines to a top surface of the substrate. Accordingly, contact area between the active regions and capacitor contacts formed thereon can be increased. In addition, by using such configuration for increasing the contact area of the active regions may prevent from compromising isolation of the active regions from the adjacent word lines extending in between the active regions. Further, since the word lines have the thick bottom portions, the word line can still be promised with a low resistivity.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:
a semiconductor substrate, having active regions separated from one another and extending along a first direction;
word lines, formed in the semiconductor substrate, wherein the active regions are respectively intersected with one or more of the word lines, the word lines respectively have separate thick portions and a narrow portion continuously extending on the thick portions along a second direction, and the thick portions are located at where the word lines are intersected with the active regions; and
bit lines, formed over the semiconductor substrate and extending along a third direction intersected with the first and second directions.

2. The semiconductor device according to claim 1, wherein the thick portions of the word lines extend along the first direction.

3. The semiconductor device according to claim 1, wherein the word lines within the active regions have a first bottom width, the word lines extend in between the active regions have a second bottom width, and the first bottom width is greater than the second bottom width.

4. The semiconductor device according to claim 1, wherein first sections of the narrow portions are located within the active regions and lying above the thick portions, second sections of the narrow portions are extending between the active regions, and the second sections have a height greater than a height of the first sections.

5. The semiconductor device according to claim 4, further comprising a trench isolation structure formed in the semiconductor substrate and spreading between the active regions, wherein the second sections of the narrow portions are extending in the trench isolation structure.

6. The semiconductor device according to claim 4, wherein the second sections of the narrow portions respectively a bottom part and a top part wider than the bottom part.

7. The semiconductor device according to claim 4, wherein bottom ends of the second sections of the narrow portions are lower than bottom ends of the first sections of the narrow portions, and lower than bottom ends of the thick portions.

8. The semiconductor device according to claim 4, wherein the second sections of the narrow portion of each word line with different lengths are alternately arranged along the second direction.

9. The semiconductor device according to claim 1, wherein the thick portions of one of the word lines are laterally spaced apart from the narrow portion of an adjacent one of the word lines along the first direction by a first spacing, the narrow portion of the one of the word lines is laterally spaced apart from the narrow portion of the adjacent one of the word lines along the first direction by a second spacing, and the first spacing is shorter than the second spacing.

10. The semiconductor device according to claim 1, wherein air gaps are formed in the thick portions of the word lines, respectively.

11. The semiconductor device according to claim 1, wherein each of the word lines further comprises an additional conductive material continuously extending on the narrow portion, and the additional conductive material and remainder of each of the word lines are made of different materials having different work functions.

12. The semiconductor device according to claim 11, wherein each of the word lines further comprises a barrier layer lying between the narrow portion and the additional conductive material.

13. A manufacturing method of a semiconductor device, comprising:
- providing a semiconductor substrate with active regions and a trench isolation structure, wherein the active regions extend along a first direction, and the trench isolation structure spreads between the active regions;
- forming initial gate trenches at a top surface of the semiconductor substrate, wherein the initial gate trenches extend through the active regions and the trench isolation structure along a second direction intersected with the first direction;
- forming insulating lining layers on sidewalls of the initial gate trenches;
- further extending the initial gate trenches downwardly into the semiconductor substrate by an etching process using the insulating lining layers as masks, so as to form gate trenches;
- performing a first oxidation process to oxidize exposed surfaces of portions of the gate trenches within the active regions, so as to form sacrificial layers;
- removing the insulating lining layers and the sacrificial layers; and
- filling a conductive material into the gate trenches, in order to form word lines.

14. The manufacturing method of the semiconductor device according to claim 13, wherein bottom ends of portions of the gate trenches within the trench isolation structure are lower than bottom ends of portions of the gate trenches within the active regions.

15. The manufacturing method of the semiconductor device according to claim 13, wherein the portions of the gate trenches within the active regions respectively have a top part and a bottom part wider than the top part after removal of the insulating lining layers and the sacrificial layers.

16. The manufacturing method of the semiconductor device according to claim 13, wherein the portions of the gate trenches within the trench isolation structure TI respectively have a bottom part and a top part wider than the bottom part after removal of the insulating lining layers.

17. The manufacturing method of the semiconductor device according to claim 13, wherein a thickness of the sacrificial layers is greater than a thickness of the insulating lining layers.

18. The manufacturing method of the semiconductor device according to claim 13, wherein the insulating lining layers and the sacrificial layers are removed by an isotropic etching process.

19. The manufacturing method of the semiconductor device according to claim 13, further comprising: performing a second oxidation process after removal of the sacrificial layers as well as the insulating lining layers and before forming the word lines, wherein exposed surfaces of portions of the gate trenches within the active regions are oxidized to form gate dielectric layers.

20. The manufacturing method of the semiconductor device according to claim 13, wherein air gaps are formed in portions of the word lines extending through the active regions.

* * * * *